METHOD AND APPARATUS FOR MAKING A CIRCUIT COMPONENT WITH A CIRCUIT ELEMENT AND WIRE LEADS SEALED IN A GLASS SLEEVE

Filed June 1, 1964 2 Sheets-Sheet 1

INVENTOR.
VINCENT J. ALESSI
BY HIS ATTORNEYS
HARRIS, KIECH, RUSSELL & KERN

INVENTOR.
VINCENT J. ALESSI
BY HIS ATTORNEYS
HARRIS, KIECH, RUSSELL & KERN 3,365,284

METHOD AND APPARATUS FOR MAKING A CIRCUIT COMPONENT WITH A CIRCUIT ELEMENT AND WIRE LEADS SEALED IN A GLASS SLEEVE

Vincent J. Alessi, 8710 Pershing Drive, Playa Del Rey, Calif.
Filed June 1, 1964, Ser. No. 371,414
9 Claims. (Cl. 65—59)

ABSTRACT OF THE DISCLOSURE

A method of making diodes and other circuit components comprising a circuit element sealed in glass between lead wire ends and including the steps of feeding wire ends to an assembly zone, feeding the circuit element to the assembly zone for positioning in engagement with the butt ends of the wire leads, feeding a sleeve to the assembly zone for overlying the element and the lead ends, and heating the element, sleeve and lead ends to seal the lead ends to the element and seal the sleeve to the leads. Apparatus for making the circuit components, including means for feeding elements one at a time to an assembly position, means for feeding wire leads from spools toward the assembly position from opposite sides of the element, means for compressing the element between the lead ends, means for feeding sleeves one at a time to the assembly position over the lead ends and element, means for heating the element, lead ends and sleeve to a sealing temperature, and means for cutting each lead to a desired length.

This invention relates to new circuit components, new methods of making circuit components, and new apparatus for making circuit components. The invention is particularly directed to a variety of sealed circuit components including diodes, resistors, rectifiers, capacitors, transducer elements, coils, switches and relays, radiation detectors, and photoelectric and photovoltaic devices. The invention will be described herein as applied to conventional solid state diodes but its application to other circuit elements will be readily understood.

It is an object of the invention to provide a new and improved sealed electrical circuit component which is simple in design, incorporates few parts, is inexpensive and rugged. A further object is to provide a new and improved method of making sealed circuit components which method is continuous and requires no manual handling of the parts and no intermediate storage of parts, subassemblies, etc. An additional object of the invention is to provide new and improved apparatus for the continuous manufacture, testing and packaging of sealed circuit components.

It is a specific object of the invention to provide a new and improved circuit component such as a diode or the like and comprising a circuit element having a pair of terminal faces with a wire lead butt joined to each terminal face and with a tubular glass sleeve encasing the circuit element and lead ends and fused to the lead ends. A particular advantage of this construction is the utilization of simple wire leads which are directly connected to the circuit element and which do not require any prior terminal forming operation or any intermediary terminal structures.

It is a particular object of the invention to provide a new and improved method of making an electrical circuit component including the steps of feeding the wire leads to an assembly zone, feeding an element to the assembly zone for positioning in engagement with the butt ends of the wire leads, feeding a glass sleeve to the assembly zone for overlying the element and lead ends, and heating the element, sleeve and lead ends to seal the lead ends to the element and seal the sleeve to the leads. A further object is to provide such a method wherein the wire leads are fed from bulk storage such as continuous spools of wire thereby eliminating any handling of individual leads. A further and specific object of the invention is to provide such a method utilizing coated wire as the lead wire with the lead cutting operation acting to smear the wire coating over the butt ends of the wire to bring the coating material into position for contacting the circuit element for the subsequent alloying operation by which the lead is joined to the element.

It is an object of the invention to provide such a method including the additional steps of transferring the sealed circuit component to a conveyor system, moving the component past various testing, marking and sorting stations, and packing the sorted components for storage and distribution.

It is a particular object of the invention to provide new and improved apparatus for making circuit components including means for feeding circuit elements one at a time to an assembly position, means for feeding wire leads from spools toward the assembly position from opposite sides of the element and including means for compressing the element between the lead ends, means for feeding sleeves one at a time to the assembly position over the lead ends and element, means for heating the element, lead ends and sleeves to a sealing temperature, and means for cutting each lead to a desired length. A further object is to provide such an apparatus wherein the various feeding, heating and cutting steps are carried out at a single location to complete the circuit component. An additional object is to provide such an apparatus wherein the various steps are carried out at various positions of a moving work table permitting the apparatus to have a number of components in various stages of assembly at one time.

The invention also comprises novel details of construction and novel combinations and arrangements of parts, which will more fully appear in the course of the following description. The drawings merely show and the description merely describes preferred embodiments of the present invention which are given by way of illustration or example.

Figure 4:
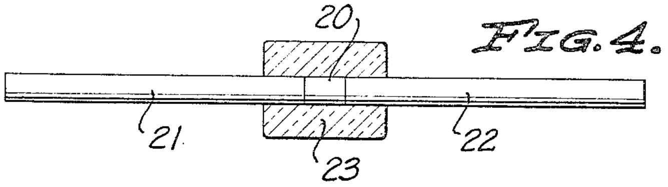
FIG. 4 illustrates a completed circuit component.

The circuit component of FIG. 4 typically may be a solid state diode comprising a silicon junction dice 20, leads 21, 22 and a glass sleeve 23. The butt ends of the leads 21, 22 are joined by alloying to opposing faces of the dice 20. The glass sleeve 23 is fused to the lead ends to provide a completely hermetically sealed component.

The leads preferably are of metal wire having a temperature coefficient of expansion substantially the same as that of the circuit element and the glass sleeve. Also, the lead material and the glass composition preferably are selected so that the lead-to-silicon dice alloying and the lead-to-sleeve fusing occur at substantially the same temperature permitting the complete joining and sealing operation to be performed at one time. In a typical unit, the wire leads will be a silver clad nickel-iron wire and the glass will be a potash-soda-lead glass, such as Corning G12 (0120), which permit sealing at 850° C. Of course, copper clad nickel-iron wire and other alloys such as dumet wires may be utilized. The particular wire and glass utilized in any specific component may be varied to suit various applications, keeping in mind the criteria set out above.

Figures 1, 2:
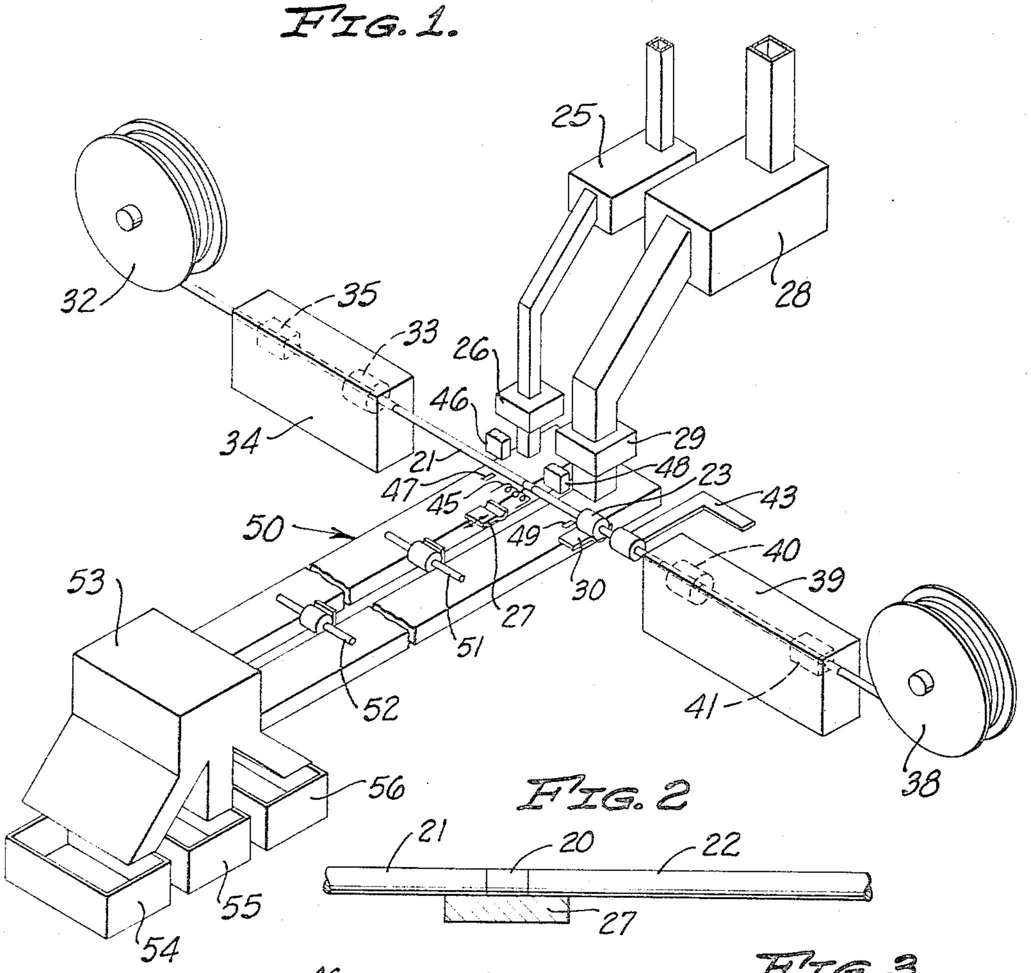
FIG. 1 is a perspective view of a preferred form of apparatus for performing the method of the invention.
FIGS. 2 and 3 illustrate two steps in the assembly of a circuit component.

Referring now to the apparatus of FIG. 1, a silicon dice 20 is fed from a vibratory feeder 25 through a metering escapement 26 to the assembly position where it may rest in a groove in an arm 27. A sleeve 23 is fed from another vibratory feeder 28 through a metering escapement 29 to rest on another arm 30.

A lead wire from a spool 32 is advanced by a chuck 33 in a wire drive mechanism 34 through a wire straightener 35 to bring the butt end of the lead wire 21 into engagement with the dice 20, as best seen in FIG. 2. Similarly, wire from another spool 38 is fed through a drive mechanism 39 having a chuck 40 and wire straightener 41, with the lead 22 passing through the sleeve 23 to engage the other face of the dice 20.

Figure 3:
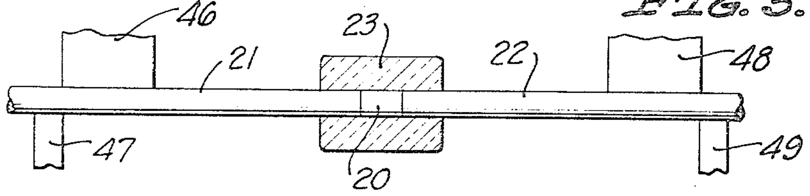

The wire feed mechanisms 34, 39 maintain a compressive force on the dice 20, permitting the arm 27 to be withdrawn to the position of FIG. 1, after which the sleeve 23 is advanced by an arm 43 to overlie the dice and lead ends, as seen in FIG. 3.

The temperature of the circuit element, the glass and the ends of the leads is raised to the sealing temperature as by means of a heating coil 45. The wire leads are now cut to the desired length by anvil 46 and blade 47 and anvil 48 and blade 49 producing the completed component of FIG. 4. The component is now transferred to the ways of a conveyor 50, as by the arm 27.

The wire lead cutting operation is preferably performed so that the coating material on the wire is smeared over the freshly cut butt end to bring this coating material into position for engagement with the next circuit element to be fed into the apparatus, as the alloying operation is best carried out with the silver or copper wire coating material rather than with the wire core material. The degree of smearing occurring during shearing may be varied by controlling the shear blade sharpness and the pressure between the blades.

Completed circuit elements 51, 52 are moved along the conveyor 50 past any desired number of stations where various electrical tests may be performed on the components. At one station, the components may be symbolized by the application of painted or printed markings, depending upon the results of the preceding tests. Finally, the components are directed to a sorter 53 where each component is directed to a particular container 54, 55, 56 by means of electrically operated gates, depending upon the characteristics of the specific component as determined by the testing. The components may be stored and shipped in the containers or may be conveyed on to automatic packaging machines for appropriate packaging.

The method and apparatus described above provide a complete and continuous operation for the manufacture of an electrical circuit component without requiring any intermediate storage of subassemblies and without requiring any manual manipulation of the various elements. Of course, the method itself could be carried out by hand if desired.

Figures 5, 6, 7, 8, 9, 10, 11:
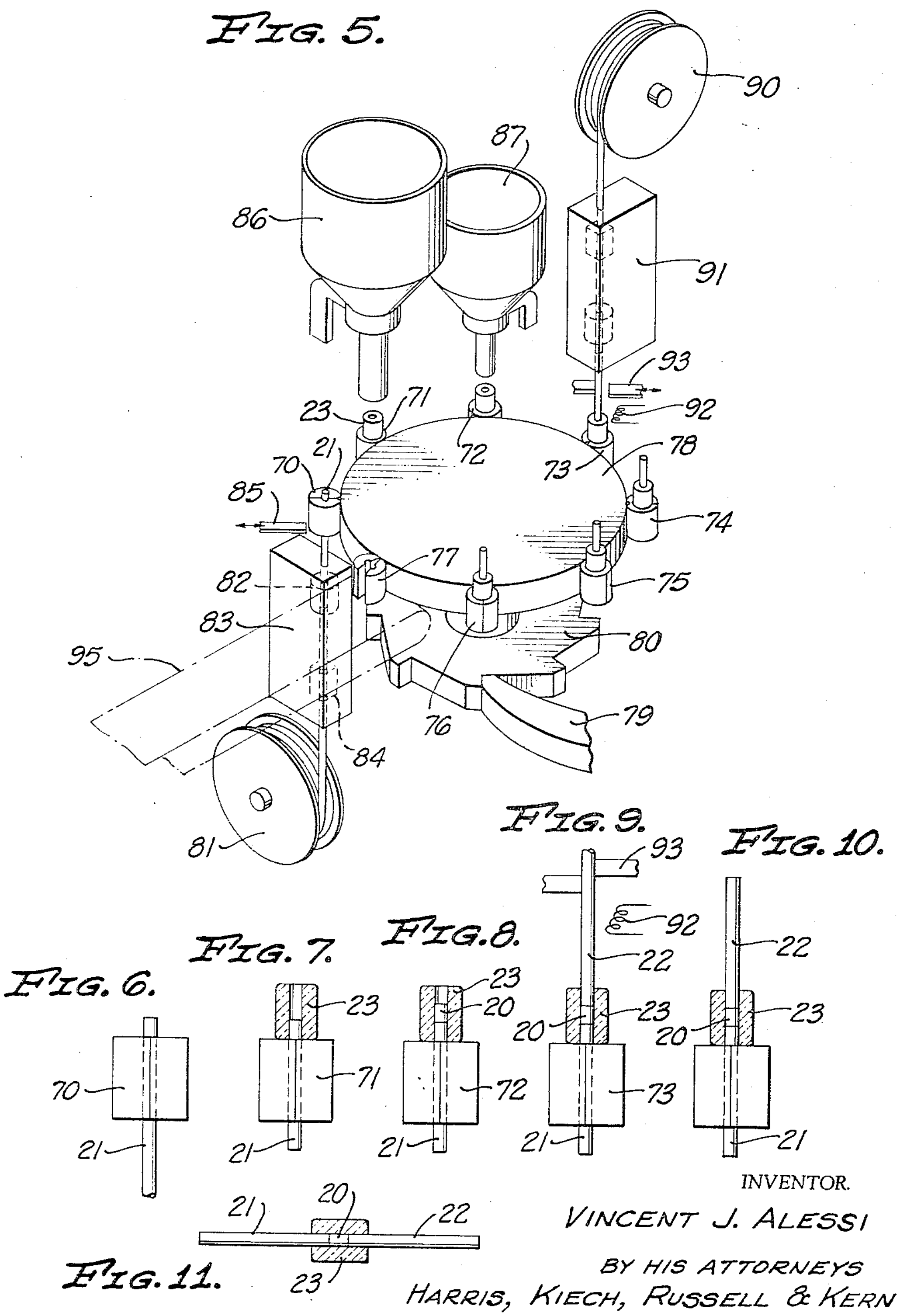
FIG. 5 is a perspective view of an alternative form of apparatus for performing the method of the invention.
FIGS. 6–10 illustrate five steps in the process of forming the circuit component by the apparatus of FIG. 5.
FIG. 11 illustrates a completed circuit component which may be identical to the component of FIG. 4.

An alternative apparatus for the manufacture of the circuit component is shown in FIG. 5. A plurality of lead clamping jaws 70–77 is carried on a work table 78 which is rotated by various indexing means, such as a pawl 79 and ratchet 80 as illustrated. With this arrangement, a number of components can be in process of assembly at the same time, with various steps performed at different positions around the work table.

An assembly operation is started by feeding wire upward from a spool 81 into the jaw 70, the wire feeding being performed by a chuck 82 in a wire fed mechanism 83 which includes a wire straightener 84. This wire, which will function as the lead 21, projects upward from the jaw 70, as seen in FIG. 6. The wire is now cut as by a shear 85 and the work table may now be rotated to bring the lead 21 to the position shown with the chuck 71.

A glass sleeve 23 is fed down onto the upwardly projecting end of the lead 21 from a feeder 86 (FIG. 7). Next the silicon dice 20 is fed down into the sleeve from another feeder 87 (FIG. 8).

At the position of the chuck 73, the other lead wire is fed downward from a spool 90 to a wire drive mechanism 91 and into the sleeve 23 engaging the upper terminal surface of the silicon dice. The assembly is heated as by an induction coil 92 and the upper lead wire is cut by shear 93 to produce the completed component as seen in FIG. 10.

In an alternative arrangement, the upper wire may be cut and the assembly may then be transferred to the next position for heating and sealing. The component is finally transferred to the position of the jaw 77 and is released onto a conveyor 95 for testing and further handling as in the apparatus of FIG. 1.

It will be readily understood that the invention is not limited to solid state diodes and that the method and apparatus described herein are equally suitable for the manufacture of other electrical circuit components utilizing other electrical elements since the characteristics of the element itself are not a factor in the operations. The only requirement on the circuit element itself is that it have terminal faces to which the wire leads can be joined by heating in an alloying or soldering operation.

Although exemplary embodiments of the invention have been disclosed and discussed, it will be understood that other applications of the invention are possible and that the embodiments disclosed may be subjected to various changes, modifications and substitutions without necessarily departing from the spirit of the invention.

I claim as my invention:

1. A method of making an electrical circuit component having a circuit element, wire leads and a glass sleeve, including the steps of:
   - feeding an element to an assembly zone;
   - feeding a sleeve to a position adjacent the element;
   - feeding continuous wire leads to the zone to engage opposing faces of the element, with one of the leads passing through the sleeve;
   - advancing the sleeve along the wire lead to cover the element and sleeve ends forming a component assembly;
   - heating the assembly to seal the lead ends to the element and seal the sleeve to the leads; and
   - cutting both wire leads to desired lengths.

2. A method of making an electrical circuit component having a circuit element, wire leads and a glass sleeve, including the steps of:
   - feeding a first continuous wire lead to an assembly zone;
   - cutting the first wire lead to the desired length;
   - feeding a sleeve onto an end of the first lead;
   - feeding an element into the sleeve in engagement with the end of the first lead;
   - feeding a second continuous wire lead into the sleeve in engagement with the element to form a component assembly;
   - applying axial force to the wire leads to clamp the element between aligned butt ends of the wire leads;
   - cutting the second lead to the desired length; and
   - heating the assembly to seal the lead ends to the element and seal the sleeve to the leads.

3. In an apparatus for making circuit components comprising a circuit element sealed in glass between lead wire ends, the combination of:
   - means for feeding elements one at a time to an assembly position;
   - means for supporting first and second spools of lead wire;

means for feeding wire leads from each of said spools toward the assembly position from opposite sides of the element and including means for applying a compression force to the leads for compressing the element between the lead ends;

means for feeding sleeves one at a time to the assembly position over the lead ends and element;

means for heating the element, lead ends and sleeve to a sealing temperature; and means for cutting each lead to a desired length.

4. In an apparatus for making circuit components comprising a circuit element sealed in glass between lead wire ends, the combination of:

means for feeding elements one at a time to an assembly position;

means for feeding sleeves one at a time to a position adjacent the assembly position;

means for feeding a first wire lead from a spool through the sleeve to contact one side of the element and for withdrawing the wire from the sleeve position;

means for feeding a second wire lead from a spool to contact the opposite side of the element, said means for feeding leads including means for compressing the element between the lead ends;

means for feeding the sleeve along the first lead to overlie the element and lead ends;

means for heating the sleeves, lead ends and element to a sealing temperature; and means for cutting each of the wire leads to a desired length.

5. In an apparatus for making circuit components comprising a circuit element sealed in glass between lead wire ends, the combination of:

means for supporting first and second spools of lead wire;

a jaw unit for gripping a wire lead;

means for feeding a first wire lead from said first spool into said jaw unit;

means for cutting said first lead to a desired length with a portion thereof projecting from said jaw unit;

means for feeding a sleeve onto said projecting portion of said first lead;

means for feeding an element into said sleeve and into contact with the end of said first lead;

means for feeding a second wire lead from said second spool into said sleeve with the end of said second lead in contact with said element and including means for applying a compression force to the leads for compressing the element between the lead ends;

means for heating said sleeve, lead ends and element to a sealing temperature; and means for cutting said second lead to a desired length.

6. In an apparatus for making circuit components comprising a circuit element sealed in glass between lead wire ends, the combination of:

a work table having a jaw unit for gripping a wire lead;

means for rotating said table to move said jaw unit to each of a plurality of working positions;

means for supporting first and second spools of lead wire;

means for feeding a first wire lead from said first spool into said jaw unit while at a first working position;

means for cutting said first lead to a desired length with a portion projecting from said jaw unit while at said first position;

means for feeding a sleeve onto said exposed portion while at a succeeding position;

means for feeding an element into said sleeve and into contact with the lead end while at a succeeding position;

means for feeding a second wire lead from said second spool into said sleeve and into contact with said element at a succeeding position and including means for applying a compression force to the leads for compressing the element between the lead ends;

means for heating said sleeve, lead ends and element to a sealing temperature while at said last recited position;

means for cutting said second lead to a desired length while at said last recited position; and means for releasing the sealed assembly from said jaw unit.

7. A method of making an electrical circuit component having a circuit element, wire leads and a glass sleeve, including the steps of:

feeding a sleeve to a first position;

feeding wire leads to an assembly zone from opposite directions, with one of the leads passing through the sleeve;

feeding an element to the assembly zone for positioning in engagement with the butt ends of the wire leads;

applying axial compression forces to the wire leads to support the element between the lead ends;

feeding the sleeve from the first position to the assembly zone for overlying the element and the lead ends; and heating the element, sleeve and lead ends to seal the lead ends to the element and seal the sleeve to the leads.

8. A method of making an electrical circuit component having a circuit element, wire leads and a glass sleeve, including the steps of:

feeding continuous wire leads from opposite directions to an assembly zone;

feeding an element to the assembly zone for positioning in engagement with the butt ends of the wire leads;

applying axial force to the wire leads to clamp the element between aligned butt ends of the wire leads;

feeding a sleeve to the assembly zone overlying the element and the wire leads;

heating the element, sleeve and lead ends to seal the lead ends to the element and seal the sleeve to the leads; and cutting each of the leads to a desired length.

9. The method as defined in claim 8 including cutting each of the leads to a desired length by shearing to carry the surface material of the wires onto the cut ends thereof.

References Cited

UNITED STATES PATENTS

| | | | |
|---|---|---|---|
| 2,212,556 | 8/1940 | Baier | 65—18 |
| 2,694,168 | 11/1954 | North et al. | 317—234 |
| 2,697,309 | 12/1954 | Gates | 65—59 |
| 3,050,666 | 8/1962 | Stump | 317—234 |
| 3,144,318 | 8/1964 | Bruen et al. | 65—18 |
| 3,271,124 | 9/1966 | Clark | 65—59 X |

DONALL H. SYLVESTER, *Primary Examiner.*

A. D. KELLOGG, *Assistant Examiner.*